(12) United States Patent  
Shen

(10) Patent No.: US 11,923,031 B2
(45) Date of Patent: Mar. 5, 2024

(54) TRACKING CHARGE LOSS IN MEMORY SUB-SYSTEMS

(71) Applicant: MICRON TECHNOLOGY, INC., Boise, ID (US)

(72) Inventor: Guang Shen, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 303 days.

(21) Appl. No.: 17/419,107

(22) PCT Filed: Dec. 18, 2020

(86) PCT No.: PCT/CN2020/137603
§ 371 (c)(1),
(2) Date: Jun. 28, 2021

(87) PCT Pub. No.: WO2022/126595
PCT Pub. Date: Jun. 23, 2022

(65) Prior Publication Data
US 2023/0017602 A1 Jan. 19, 2023

(51) Int. Cl.
G11C 29/00 (2006.01)
G06F 3/06 (2006.01)
G11C 29/50 (2006.01)

(52) U.S. Cl.
CPC ...... G11C 29/50004 (2013.01); G06F 3/0619 (2013.01); G06F 3/0653 (2013.01); G06F 3/0679 (2013.01)

(58) Field of Classification Search
CPC ............. G11C 29/50004; G06F 3/0619; G06F 3/0653; G06F 3/0679
See application file for complete search history.

(56) References Cited

U.S. PATENT DOCUMENTS

| 11,385,802 | B2* | 7/2022 | Sharon | G11C 16/3431 |
| 2014/0286102 | A1 | 9/2014 | Wu et al. | |
| 2014/0334228 | A1 | 11/2014 | Kim et al. | |
| 2015/0339057 | A1 | 11/2015 | Choi et al. | |
| 2017/0255403 | A1* | 9/2017 | Sharon | G11C 11/5628 |
| 2017/0271031 | A1 | 9/2017 | Sharon et al. | |
| 2020/0225852 | A1* | 7/2020 | Sharon | G06F 11/1068 |

OTHER PUBLICATIONS

PCT Notification of Transmittal of the International Search Report and the Written Opinion of the International Searching Authority for PCT Application No. PCT/CN2020/137603, dated Sep. 24, 2021, 9 pages.

* cited by examiner

Primary Examiner — Samir W Rizk
(74) Attorney, Agent, or Firm — Lowenstein Sandler LLP

(57) ABSTRACT

Disclosed is a system that comprises a memory device and a processing device, operatively coupled with the memory device, to perform operations that include, identifying a block family comprising a plurality of blocks of the memory device. The operations performed by the processing device further include associating the block family with a threshold voltage offset. The operations performed by the processing device further include computing an adjustment value of the threshold voltage offset, wherein the adjustment value reflects a time period that has elapsed since a triggering event and a temperature of a memory component carrying one or more blocks of the plurality of blocks.

20 Claims, 9 Drawing Sheets

SuperBlock Table 610

| SuperBlock | Partition | Time Hr | Temp | Family |
|---|---|---|---|---|
| 0 | 0 | 10 | 31 | 4 |
| 0 | 1 | 11 | 35 | 5 |
| 0 | 2 | 11 | 50 | 20 |
| ... | ... | ... | ... | ... |
| 0 | 31 | | | 20 |
| 1 | 0 | | | 22 |
| 1 | 1 | | | 0 |
| 1 | 2 | | | 0 |
| 1 | 3 | | | 0 |
| ... | ... | ... | ... | ... |
| 1 | 30 | | | 22 |
| 1 | 31 | | | 0 |
| ... | ... | ... | ... | ... |
| 745 | 29 | | | 0 |
| 745 | 30 | | | 0 |
| 745 | 31 | | | 0 |

Family Table 620

| Index | Die 0 bin | Die 1 bin | ... | Die N bin |
|---|---|---|---|---|
| 1 | 5 | 6 | | 4 |
| 2 | 4 | 2 | | 5 |
| 3 | | | | |
| 4 | 3 | | | |
| 5 | | | | |
| ... | | | | |
| 20 | | | | |
| 21 | | | | |
| 22 | | | | |
| ... | | | | |
| 62 | | | | |
| 63 | | | | |
| 64 | | | | |

Offset table 630

| Bin | TLC1 | TLC2 | TLC3 | TLC4 | TLC5 | TLC6 | TLC7 | MLC1 | MLC2 | MLC3 | SLC |
|---|---|---|---|---|---|---|---|---|---|---|---|
| 1 | 0 | 1 | 1 | -1 | -2 | -3 | -4 | 0 | 2 | 2 | 2 |
| 2 | | | | | | | | | | | |
| 3 | | | | | | | | | | | |
| ... | | | | | | | | | | | |
| 64 | | | | | | | | | | | |

Accumulated threshold voltage offset table 640

| | Current DAC | Accumulated DAC |
|---|---|---|
| block 0 | 0xff | 0xff |
| block 1 | -10 | -0.003 |
| block 2 | -15 | -0.89 |
| block 3 | -30 | -0.23 |
| ... | | |
| block n | 0xff | 0xff |

FIG. 6

TRACKING CHARGE LOSS IN MEMORY SUB-SYSTEMS

TECHNICAL FIELD

Embodiments of the disclosure relate generally to memory sub-systems, and more specifically, relate to tracking charge loss in memory sub-systems.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 6 schematically illustrates example metadata maintained by the memory sub-system controller for associating blocks and/or partitions with block families, in accordance with embodiments of the present disclosure.

DETAILED DESCRIPTION

Figure 1:
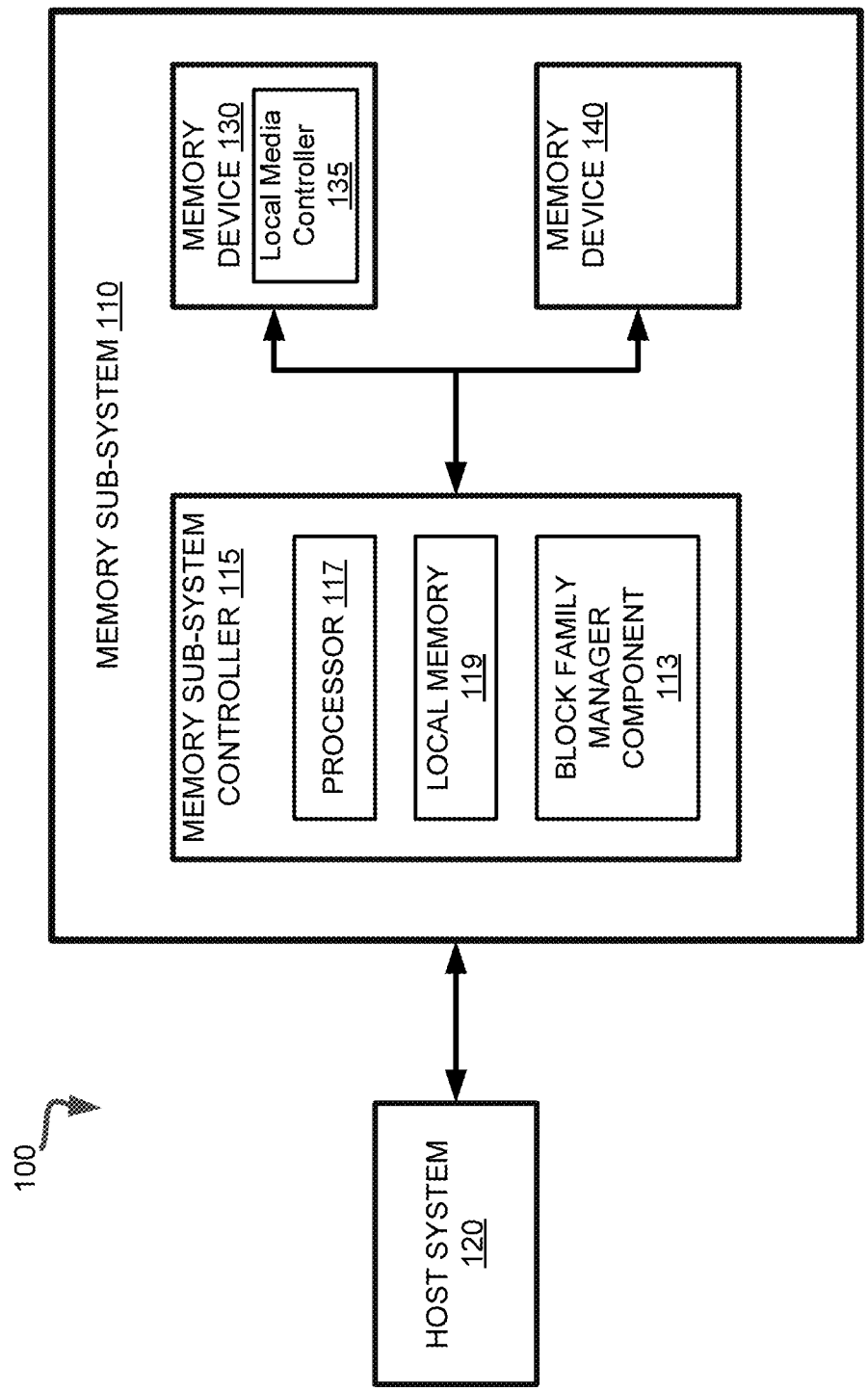
FIG. 1 illustrates an example computing system that includes a memory sub-system in accordance with some embodiments of the present disclosure.

Aspects of the present disclosure are directed to tracking charge loss in memory sub-systems. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g., used to distinguish age of data written), valid bitmap (which LBAs or logical transfer units contain valid data), etc.

A memory device includes multiple memory cells capable of storing, depending on the memory cell type, one or more bits of information. A memory cell can be programmed (written to) by applying a certain voltage to the memory cell, which results in an electric charge being held by the memory cell, thus determining a voltage signal $V_{CG}$ that has to be applied to a control electrode of the cell to open the cell to the flow of electric current across the cell, between the source electrode and the drain electrode. More specifically, for each individual memory cell (having a charge Q stored thereon) there can be a threshold control gate voltage $V_T$ (herein also referred to as the "threshold voltage" or simply as "threshold") such that for $V_{CG} < V_T$ the source-drain electric current is low. The current increases substantially once the control gate voltage has exceeded the threshold voltage, $V_{CG} > V_T$. Because the actual geometry of the electrodes and gates varies from cell to cell, the threshold voltages $V_T$ can be different even for cells implemented on the same die. The memory cells can, therefore, be characterized by a distribution P of the threshold voltages, $P(Q, V_T) = dW/dV_T$, where dW represents the probability that any given cell has its threshold voltage within the interval $[V_T, V_T + dV_T]$ when charge Q is placed on the cell.

A high-quality memory device can have distributions $P(Q, V_T)$ that are narrow compared with the working range of control voltages tolerated by the cells of the device. Accordingly, multiple non-overlapping distributions P($Q_k$, $V_T$) ("valleys") can be fit into the working range allowing storing and reliably detecting multiple values of the charge $Q_k$, k=1, 2, 3 . . . The distributions (valleys) are interspersed with voltage intervals ("valley margins") where none (or very few) of the memory cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_T$ exhibited by the memory cell to one or more reference voltage levels corresponding to known valley margins (e.g., centers of the margins) of the memory device.

Due to the phenomenon known as slow charge loss (SCL), the threshold voltage $V_T$ of a memory cell can change with time as the electric charge of the cell is diminishing, the process sometimes referred to as "temporal voltage shift" (TVS). Since typical cells store negatively charged particles (electrons), the loss of electrons causes the voltage thresholds to shift along the voltage axis towards lower voltage thresholds $V_T$. The threshold voltages can change rapidly at first (immediately after the memory cell is programmed) while slowing down at larger times in an approximately power-law fashion, $\Delta V_T(t) = -C * t^b$, with respect to the time t elapsed since the cell programming event. In some embodiments of the present disclosure, TVS can be mitigated by keeping track of the time elapsed since the programming event as well as of the environmental conditions of a particular memory partition (block, plane, etc.) and associating a voltage offset $\Delta V_T$ to be used during read operations, where the standard "base read level" threshold voltage $V_T$ (displayed by the cell immediately after programming) is modified by the voltage offset: $V_T \rightarrow V_T + \Delta V_T$. Whereas TVS is a continuous process and the compensating correction $\Delta V_T(t)$ can be a continuous function of time, adequate accuracy of offsets can be achieved in some embodiments with a discrete number of offset "bins." Each bin can be associated with "families" of blocks (or any other memory partitions) programmed within a specified time window and under similar environmental (e.g., temperature) conditions. Since the time elapsed since programming and temperature conditions are among the main factors affecting the amount of TVS, different partitions within a single block family can be presumed to exhibit similar distributions of threshold voltages of their memory cells, and thus would require the same voltage offsets to be applied to the base read levels for read operations.

Block families can be created asynchronously with respect to block programming events. In an illustrative example, a new family can be created ("opened") whenever a specified period of time Δt (e.g., a predetermined number of minutes) has elapsed since the creation of the last block family or whenever the reference temperature of memory cells has changed by more than a specified threshold temperature Δθ (e.g. 10K, 5K, or any other value). Similarly, the family can be "closed" (and a new family can be created) after the time Δt has elapsed since the family was created or if the reference temperature has changed (in either direction) by more than AO. A memory sub-system controller can maintain an identifier of the active block family, which is associated with one or more blocks as they are being programmed.

The memory sub-system controller can periodically perform a calibration operation in order to associate partitions of various families with one of the bins. Each bin, in turn, can be associated with a set of the voltage offsets to be applied for read operations. The associations of partitions with families and families with bins is referred herein as auxiliary read metadata (ARM), which represent a part of broader state metrics of the memory device. The state metrics can also include the number of retired physical memory blocks (or other partitions), the number of times various physical blocks have been erased, types of configurations of cells of various memory partitions (e.g., single-level cell vs. multi-level cells), or any other type of information representative of the state of the memory device. The ARM can be stored in metadata tables maintained by the memory sub-system controller.

In accordance with embodiments of the present disclosure, the TVS can be selectively tracked for programmed partitions that are grouped into families. Based on the groupings of partitions into families, appropriate bin-specific read (voltage) offsets are applied to the base read (voltage) levels in read operations. Base read levels can also be stored in the metadata of the memory device. Upon receiving a read command, the memory sub-system controller can (1) identify the family associated with the memory partition identified by the logical address specified in the read command, (2) identify the current bin associated with the identified family, (3) determine a set of read offsets for the identified bin, (4) compute the new read voltages by additively applying the read offsets associated with the identified bin to the base read levels, and (5) perform the read operation using the new read voltage, as described in more detail below.

Various implementations, however, may either fail to adequately address the temporal voltage shift or employ inefficient strategies with respect to the impact on performance and power that results when the memory sub-system controller must frequently perform calibration operations in order to associate a block family with the voltage offset to be applied in data operations due to TVS.

Aspects of the present disclosure address the above-noted and other deficiencies by implementing a memory sub-system controller that tracks charge loss in a block family by accumulating the impact on the threshold voltage offset associated with the block family in order to minimize the amount of calibration operations that the memory sub-system controller should perform. In some embodiments, the memory sub-system controller can account for charge loss in a block of the memory device by introducing the threshold voltage offset to be applied to read operations, such that the threshold voltage offsets depends on the time elapsed since the last programming event as well as the environmental (e.g., temperature) conditions experienced by a pertinent part of the memory component. The memory sub-system controller can accumulate the changes in the threshold voltage offset over a period of time. Once the accumulated threshold voltage offset reaches a threshold voltage criterion, then the memory sub-system controller can perform one or more calibration operations in order to determine the updated new threshold voltage. Thus, the calibration would be triggered by the accumulated threshold voltage offset reaching a threshold voltage value, which results in reducing the frequency of calibration operations.

Therefore, advantages of the present disclosure include, but are not limited to, improving the performance and power consumption of the memory sub-system by reducing the frequency of calibration operations.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "super-block."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a block family manager component 113 that can be used to track charge loss in memory cells by accumulating the impact of time and temperature on the threshold voltage offset in accordance with embodiments of the present disclosure. In some embodiments, the memory sub-system controller 115 includes at least a portion of the block family manager component 113. In some embodiments, the block family manager component 113 is part of the host system 110, an application, or an operating system. In other embodiments, local media controller 135 includes at least a portion of block family manager component 113 and is configured to perform the functionality described herein. The block family manager component 113 can manage the accumulation of threshold voltage offsets based on time and temperature for block families associated with the memory devices 130, as described in more detail herein below.

Figure 2:
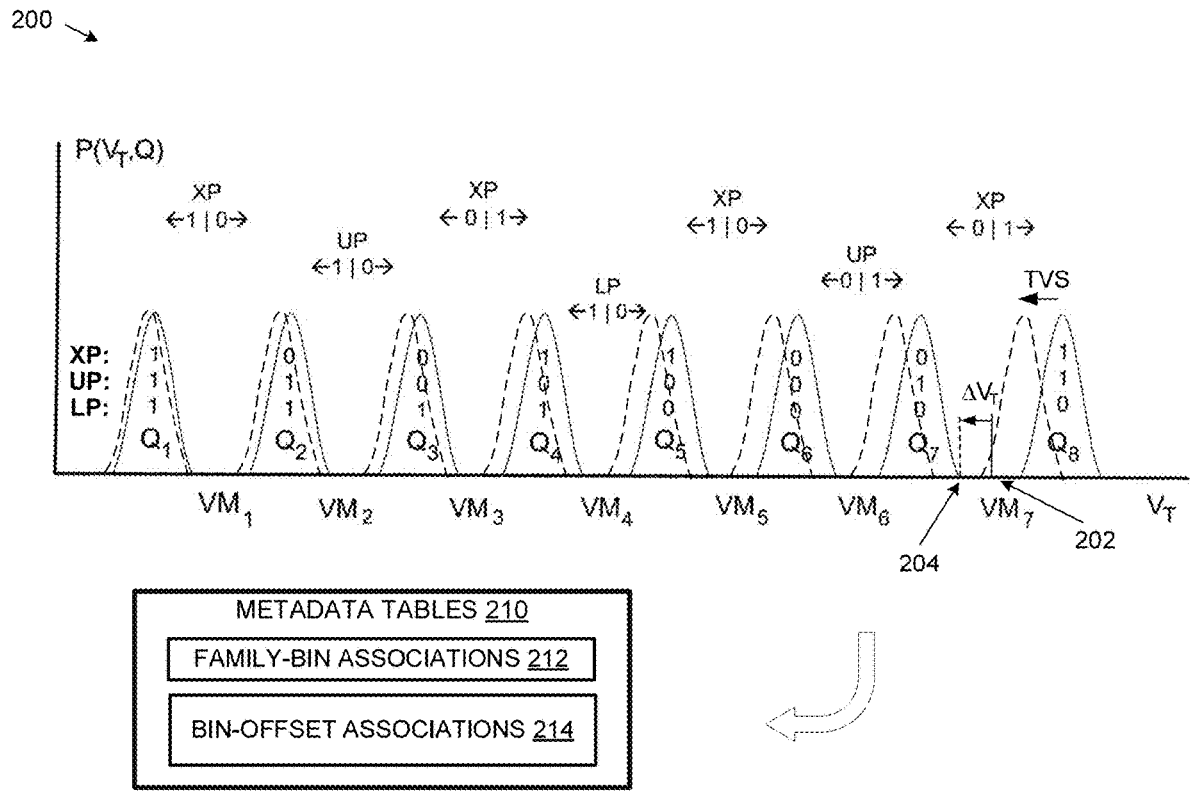
FIG. 2 illustrates schematically temporal voltage shift of a three-level memory cell capable of storing three bits of data by programming the memory cell into eight charge states that differ by the amount of charge on the cell's floating gate, in accordance with some embodiments of the present disclosure.

FIG. 2 illustrates schematically temporal voltage shift (TVS) of a three-level memory cell (TLC) capable of storing three bits of data by programming the memory cell into eight charge states $Q_k$ that differ by the amount of charge on the cell's floating gate, in accordance with some embodiments of the present disclosure. The distributions of threshold voltages $P(V_T, Q_k)$ are separated with 7 valley margins $VM_n$. The cell programmed into k-th charge state ($Q_k$) can store a particular combination of 3 bits. For example, the charge state $Q_k$ can store the binary combination 101, as depicted. This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not. A memory cell can be configured to store N=1 bits (SLC), N=2 bits (MLC), N=3 bits (TLC), N=4 bits (QLC), and so on, depending on how many distributions can be fit (and interspersed with adequate-size valley margins) within the working range of the control gate voltages. Even though FIG. 2 depicts a TLC, the operations described in the present disclosure can be applied to any N-bit memory cells.

Memory cells are typically joined by wordlines (conducting lines electrically connected to the cells' control gates) and programmed together as memory pages (e.g., 16 KB or 32 KB pages) in one setting (by selecting consecutive bitlines connected to the cells' source and drain electrodes). After three programming passes, a wordline of triple-level cells can store up to three pages: lower page (LP), upper page (UP), and extra page (XP). For example, upon the first programming pass, the cell can be driven to one of the charge states $Q_1$, $Q_2$, $Q_3$, $Q_4$ (corresponding to LP bit value 1, as shown in FIG. 2) or one of the charge states $Q_5$, $Q_6$, $Q_7$, $Q_8$ (corresponding to LP bit value 0). Upon the second path, when the UP is programmed into the same wordline, the charge state of the memory cell can be adjusted so that the range of possible locations of the cell's threshold voltage is further narrowed. For example, a cell that is in one of the charge states $Q_1$, $Q_2$, $Q_3$, or $Q_4$ (LP bit value 1) can be driven to just one of the two states $Q_1$ or $Q_2$, (corresponding to UP bit value 1) or to one of the two states $Q_3$ or $Q_4$ (corresponding to UP bit value 0). Similarly, upon the third programming path, the charge state of the memory cell can be fine-tuned even more. For example, a cell that is in the logic state 10 (i.e., UP bit stores value 1 and LP bit stores value 0) and is in one of the charge states $Q_7$ or $Q_8$ can be driven to state $Q_7$ (corresponding to XP bit value 0) or to state $Q_8$ (corresponding to XP bit value 1). Conversely, during a read operation, the memory controller 115 can determine that the applied control gate voltage $V_{CG}$ within the sixth valley margin $VM_6$ is not insufficient to open the cell to the source-drain electric current whereas the control gate voltage within the seventh valley margin $VM_7$ is sufficient to open the open the cell. Hence, the memory controller 115 can determine that the cell is in the charge state $Q_7$ corresponding to the logic state 010 (i.e. XP: 0, UP: 1, LP: 0).

The distributions of threshold voltages depicted with solid lines in FIG. 2 are distributions that the memory cells have immediately after programming. With the passage of time, as a result of a slow charge loss, the distributions shift (typically, towards lower values of $V_T$), as shown by the shifted valleys indicated with dashed lines. As a result, the threshold voltages of various memory cells are shifted by certain values $\Delta V_T$ that can depend on the time elapsed since programming, environmental conditions (e.g., ambient temperature), and so on. For optimal read operations, the controller 115 (or SSC 113) can, therefore, adjust the base read levels with the corresponding offsets $V_R \rightarrow V_R + \Delta V$, which are the same (or approximately the same) as the temporal voltage shifts. In one embodiment, the offsets can be determined (or estimated) as the difference between the center of the valley margin (such as the center 202 of $VM_7$) immediately after programming and the center of the same—but shifted—valley margin (such as the new center 204) at some later instance of time. As depicted schematically in FIG. 2, TVS of different distributions (valleys) and valley margins can differ from each other. In a typical scenario depicted in FIG. 2, TVS is greater for larger charges Q and smaller for lesser charges.

As shown in FIG. 2, the TVS in a memory device is a continuous process. In some embodiments, however, an adequate accuracy of voltage offsets can be achieved using a discrete set of bins and, accordingly, a discrete set of voltage offsets $\Delta V$. In such embodiments, TVS phenomenon can be addressed with setting up a number of discrete bins, e.g., five, eight, twenty, etc., associated with various memory partitions. The bin-related data can be stored in the metadata tables 210. The associations of various memory partitions (grouped into families, as described in more detail below) with bins can be stored in family-bin associations 212; the family-bin associations can dynamically change with the passage of time. For example, as the memory cells continue to lose charge with time, the respective memory partitions (grouped into families) can be moved, in a consecutive fashion, from junior bins to more senior bins having larger voltage offsets. Bin-offset associations 214 can also be stored in the metadata tables 210. In some embodiments, the bin-offset associations 214 can be static whereas the family-bin associations 212 can be adjusted (based on calibration of the memory partitions) to account for the actual charge loss by the memory cells of the respective partitions. In some embodiments, family-bin associations 212 can store logical addresses of the memory partitions, such as LBA of the respective blocks, while associations of LBAs with respective physical block addresses (PBA) can be stored outside the metadata tables 210, e.g., in memory translations tables stored separately in the local memory 119 or one of the memory devices 130, 140. In some embodiments, however, family-bin associations 212 can additionally include LBA-to-PBA translations or store direct PBA-to-bin associations. As schematically depicted with a curved arrow in FIG. 2, the number of bins, the bin-offset associations 214, the partition-bin associations can be based upon calibration of the memory device (or similar types of memory devices, e.g., during design and manufacturing) for maximizing performance and minimizing read errors during read operations.

Figure 3:
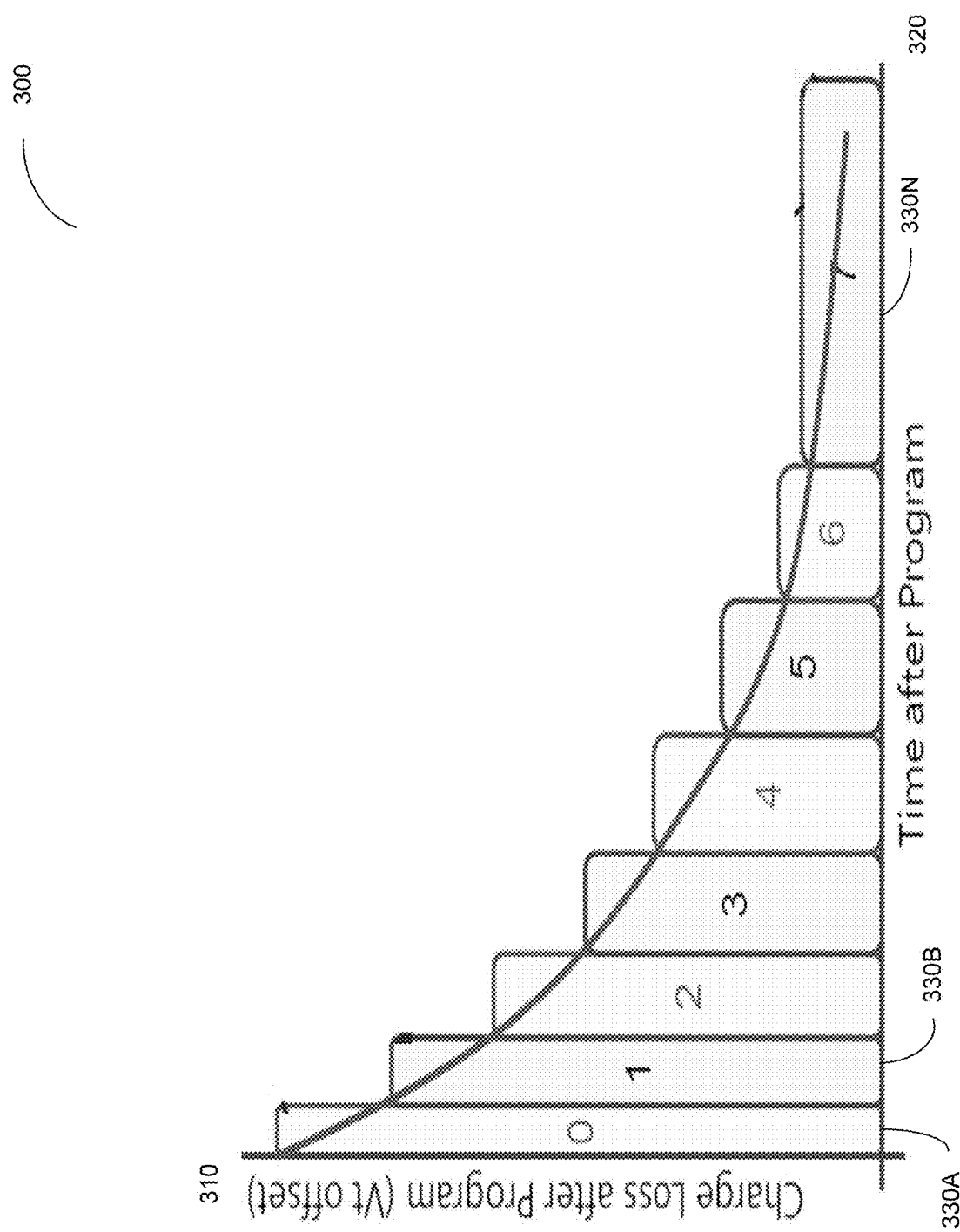
FIG. 3 depicts an example graph illustrating the dependency of the threshold voltage offset on the time after program (i.e., the period of time elapsed since the block had been programmed), in accordance with some embodiments of the present disclosure.

FIG. 3 depicts an example graph 300 illustrating the dependency of the threshold voltage offset 310 on the time after program 320 (i.e., the period of time elapsed since the block had been programmed). As schematically illustrated by FIG. 3, blocks of the memory device are grouped into block families 330A-330N, such that each block family includes one or more blocks that have been programmed within a specified time window and a specified temperature window. As noted herein above, since the time elapsed after programming and temperature are the main factors affecting the temporal voltage shift, all blocks and/or partitions within a single block family 310 are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with bin 0. Then, the memory sub-system controller can periodically perform a calibration operation in order to associate each die of every block family with one of the predefined threshold voltage offset bins (bins 0-7 in the illustrative example of FIG. 3), which is in turn associated with the voltage offset to be applied for read operations. The associations of blocks with block families and block families and dies with threshold voltage offset bins can be stored in respective metadata tables maintained by the memory sub-system controller. In various embodiments of the present disclosure, the block family manager component 113 can track the accumulation of a threshold voltage offset associated with any block family 330A-330N and perform a calibration operation once the threshold voltage offset reaches a threshold voltage criterion.

Figure 4:
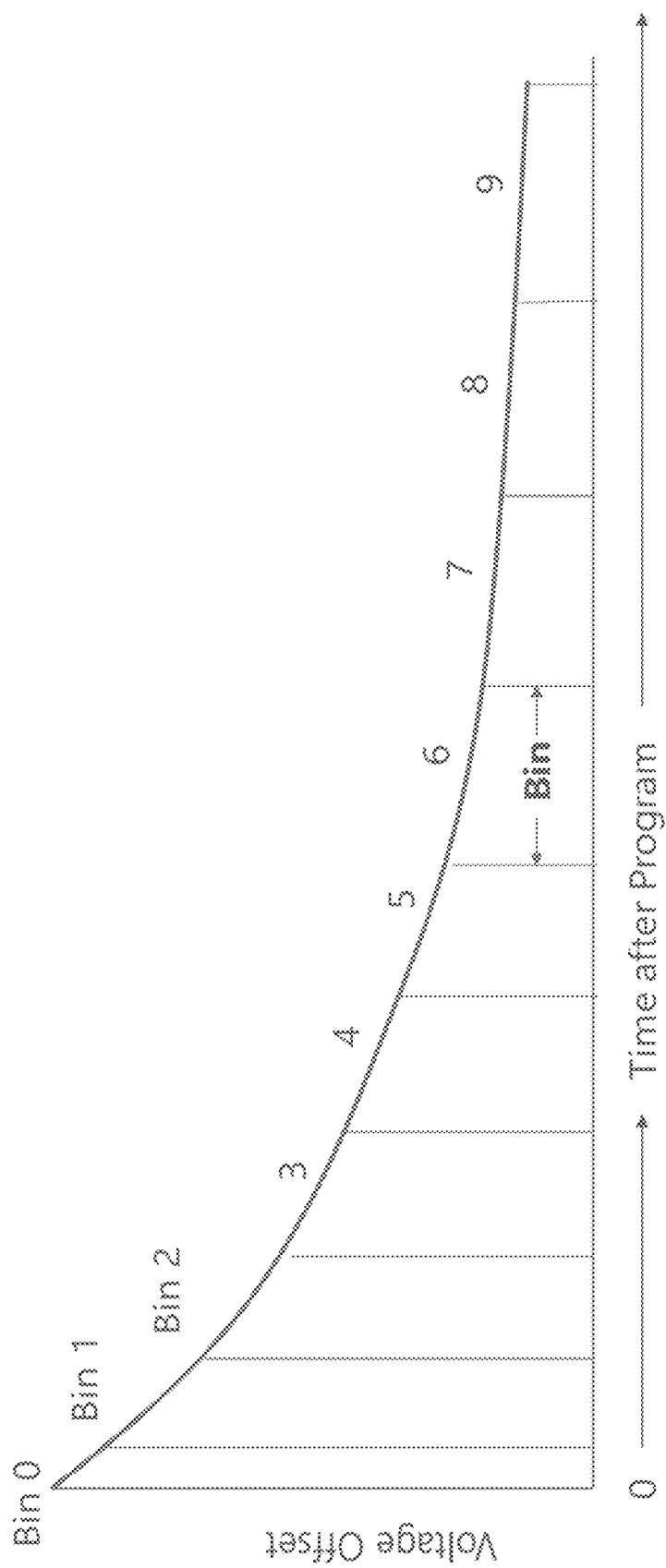
FIG. 4 schematically illustrates a set of predefined threshold voltage offset bins, in accordance with embodiments of the present disclosure.

FIG. 4 schematically illustrates a set of predefined threshold voltage offset bins (bin 0 to bin 9), in accordance with embodiments of the present disclosure. As schematically illustrated by FIG. 4, the threshold voltage offset graph can be subdivided into multiple threshold voltage offset bins, such that each bin corresponds to a predetermined range of threshold voltage offsets. While the illustrative example of FIG. 4 defines ten bins, in other implementations, various other numbers of bins can be employed (e.g., 64 bins). Based on a performed calibration operation, the memory sub-system controller associates each die of every block family with a threshold voltage offset bin, which defines a set of threshold voltage offsets to be applied to the base voltage read level in order to perform read operations, as described in more detail herein below.

Figure 5:
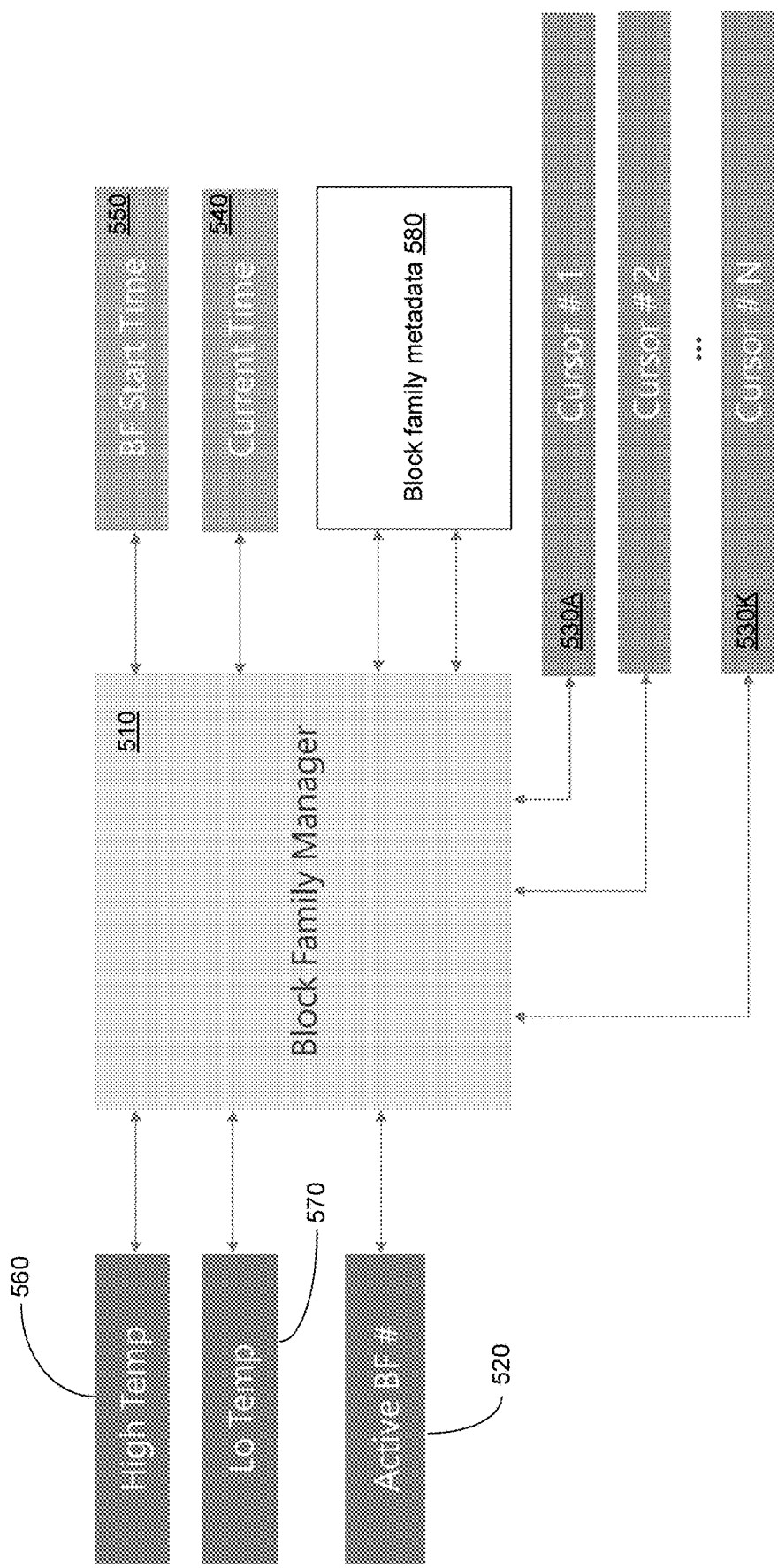
FIG. 5 schematically illustrates block family management operations implemented by the block family manager component of the memory sub-system operating in accordance with embodiments of the present disclosure.

FIG. 5 schematically illustrates block family management operations implemented by the block family manager component of the memory-sub-system controller operating in accordance with embodiments of the present disclosure. As schematically illustrated by FIG. 5, the block family manager 510 can maintain, in a memory variable, an identifier 520 of the active block family, which is associated with one or more blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, the current time 540 is stored in a memory variable as the block family start time 550. As the blocks are programmed, the current time 540 is compared to the block family start time 550. Responsive to detecting that the difference of the current time 540 and the block family start time 550 is greater than or equal to the specified time period (e.g., a predetermined number of minutes), the memory variable storing the active block family identifier 520 is updated to store the next block family number (e.g., the next sequential integer number), and the memory variable storing the block family start time 550 is updated to store the current time 540. The block family manager 510 can also use the current time 540 in order to track the charge loss associated with a block family by accumulating the impact of time on the threshold voltage offset.

The block family manager 510 can also maintain a set of memory variables for storing, for example, the high and low reference temperatures of a selected die of each memory device, as well as the various temperatures of a selected die of each memory device during a certain period of time. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager 510 can further periodically compute the difference between the high temperature 560 and the low temperature 570. Responsive to determining that the difference between the high temperature 560 and the low temperature 570 is greater than or equal to a specified temperature threshold, the block family manager 510 can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device.

The block family manager 510 can also compute the average temperature during an elapsed period of time by using stored temperature values of the given die during the specific period of time. The average temperature during an elapsed period of time can be used, for example, for computing the adjustment value of the threshold voltage offset, as described in more detail herein below with reference to FIG. 7.

At the time of programming a block, the memory sub-system controller associates the block with the currently active block family. The association of each block with a corresponding block family is reflected by the block family metadata 580, as described in more detail herein below with reference to FIG. 6.

As noted herein above, based on a calibration operation, which can be triggered by an accumulated threshold voltage offset reaching a threshold voltage criterion, the memory sub-system controller associates each die of every block family with a threshold voltage offset bin, which defines a set of threshold voltage offsets to be applied to the base voltage read level in order to perform read operations. The calibration operation involves performing, with respect to a specified number of randomly selected blocks within the block family that is being calibrated, read operations utilizing different threshold voltage offsets, and choosing the threshold voltage offset that minimizes the error rate of the read operation.

FIG. 6 schematically illustrates example metadata maintained by the memory sub-system controller for associating blocks and/or partitions with block families, in accordance with embodiments of the present disclosure. As schematically illustrated by FIG. 6, the memory sub-system controller can maintain the superblock table 610, the family table 620, the offset table 630, and accumulated threshold voltage offset table 640.

Each record of the superblock table 610 specifies the block family associated with the specified superblock and partition combination. In some implementations, the superblock table records can further include time and temperature values associated with the specified superblock and partition combination.

The family table 620 is indexed by the block family number, such that each record of the family table 620 specifies, for the block family referenced by the index of the record, a set of threshold voltage offset bins associated with respective dies of the block family. In other words, each record of the family table 620 includes a vector, each element of which specifies the threshold voltage offset bin associated with the die referenced by the index of the vector element. The threshold voltage offset bins to be associated with the block family dies can be determined by calibration operations, as described in more detail herein above.

The offset table 630 is indexed by the bin number. Each record of the offset table 630 specifies a set of threshold voltage offsets (e.g., for TLC, MLC, and/or SLC) associated with threshold voltage offset bin.

Finally, the accumulated threshold voltage offset table 640 is indexed by the block family number, such that each record of the accumulated threshold voltage offset table 640 specifies, for the block family referenced by the index of the record, the threshold voltage offset associated with the respective dies of the block family and the accumulated threshold offset voltage computed based on the impact of time and temperature.

The metadata tables 610-630 can be stored on one or more memory devices 130 of FIG. 1. In some implementations, at least part of the metadata tables can be cached in the local memory 119 of the memory sub-system controller 115 of FIG. 1.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the superblock table 610 is used to identify the block family identifier corresponding to the physical block number; then, the block family identifier is used as the index to the family table 620 in order to determine the threshold voltage offset bin associated with the block family and the die; the identified threshold voltage offset bin is used as the index to the offset table 630 in order to determine the threshold voltage offset corresponding to the bin; finally, the accumulated threshold voltage offset table 640 is used to identify whether to perform calibration operations to determine the threshold voltage offset based on whether the accumulated threshold voltage offset reaches a threshold voltage criterion. The memory sub-system controller can then additively apply the identified threshold voltage offset to the base voltage read level in order to perform the requested read operation.

Figure 7:
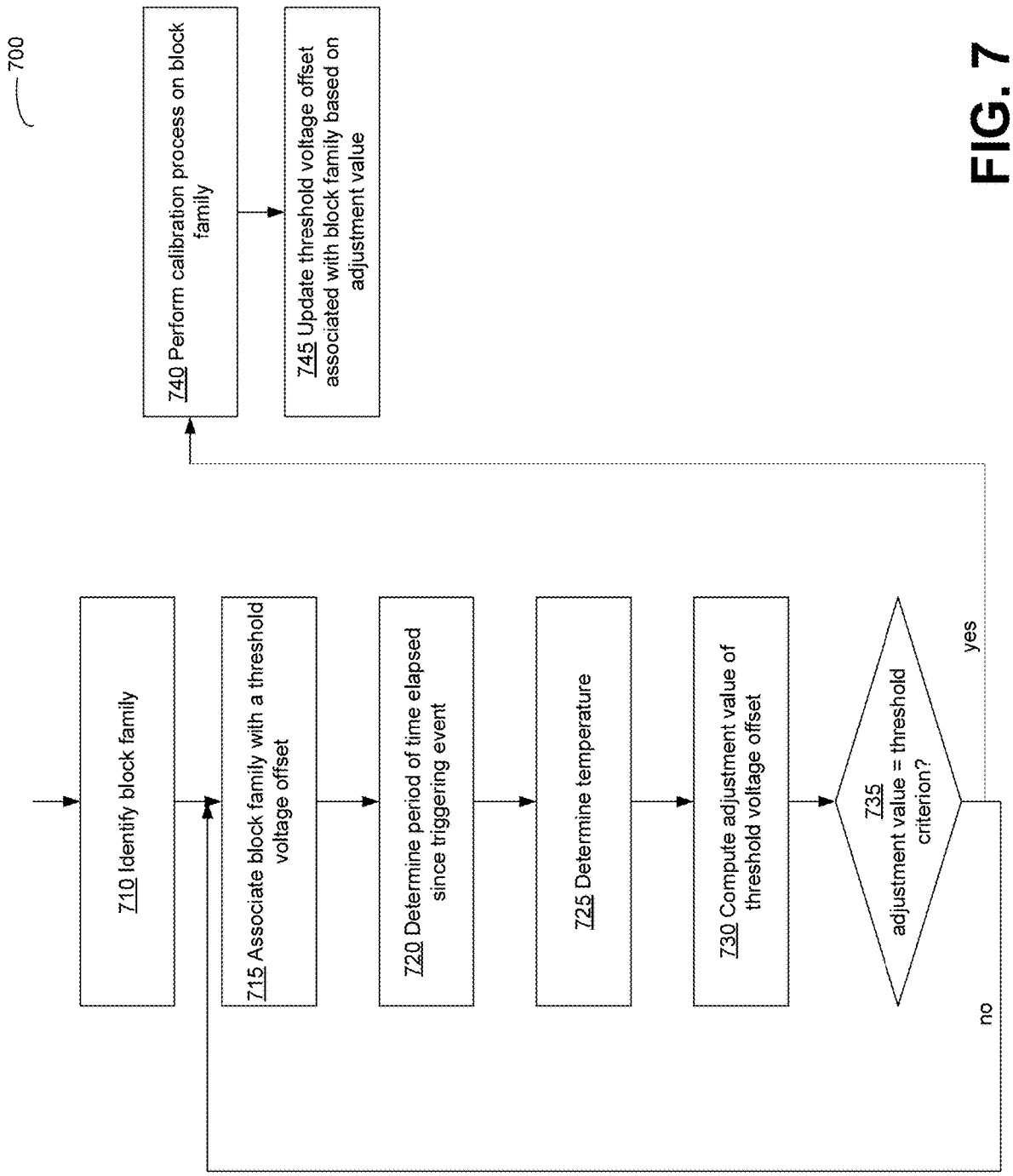
FIG. 7 is a flow diagram of an example method 700 of tracking charge loss implemented by a memory sub-system controller operating in accordance with some embodiments of the present disclosure.

FIG. 7 is a flow diagram of an example method 700 of tracking charge loss implemented by a memory sub-system controller, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic identifies a block family. The block family can comprise a plurality of blocks of the memory device. In an illustrative example, identifying the block family can comprise randomly selecting the block family from the plurality of blocks of the memory device.

At operation 715, the processing logic associates the block family with a threshold voltage offset. In an illustrative example, the processing logic utilizes the block family table 620 of FIG. 6, in order to determine the bin identifier corresponding to the combination of the block family identifier and the die identifier. The processing logic then utilizes the offset table 630 of FIG. 6 in order to determine the threshold voltage offsets for the identified threshold voltage offset bin.

At operation 720, the processing logic determines the period of time that has elapsed since a triggering event. The triggering event may be, e.g., a programming or a calibration operation with respect to one or more blocks of the block family identified by operation 710. In an illustrative example, the processing logic can utilize the block family manager 510 and the current time 540 in determining the period of time elapsed since the triggering event. For example, the block family manager 510 can compute the difference between the current time 540 to the block family start time 550 in order to get the period of time that has elapsed since the triggering event.

At operation 725, the processing logic receives a temperature measurement at the selected die of the identified block family. The temperature measurement may be the average temperature during the period of time that has elapsed since the triggering event, as computed by the block family manager 510, as explained in more detail herein above.

At operation 730, the processing logic computes the adjustment value of the threshold voltage offset. In some embodiments, the adjustment value can be computed based on the elapsed period of time that the processing logic determines at operation 720 and the temperature measurement that the processing logic receives at operation 725. The adjustment value can be represented by a function of time raised to a power of a first coefficient and multiplied by a second coefficient. The function of time can reflect the elapsed period of time that the processing logic determines at operation 720. At least one of the first and the second coefficients can reflect the temperature of the memory component, such as the temperature measurement that the processing logic receives at operation 725. The adjustment value can be additively accumulated until the adjustment value satisfies a threshold voltage criterion. Additively accumulating the adjustment value can comprise, responsive to a first triggering event, storing a first adjustment value as an accumulated threshold voltage offset. Responsive to a second triggering event, a second adjustment value can be computed as described herein above. The second adjustment value can be additively applied to the accumulated threshold voltage offset. As noted herein above, metadata reflecting the temperature measurement, the period of time elapsed, the adjustment value, and the accumulated threshold voltage offset can be maintained in one or more metadata tables 610-630 stored on the one or more memory devices 130 of FIG. 1.

At operation 735, the processing logic determines whether the adjustment value satisfies a threshold voltage criterion. In some embodiments, the adjustment value can be reflected as the accumulated threshold voltage offset, as described herein above. The threshold voltage criterion can be, for example, one or more reference voltage levels corresponding to known valley margins (e.g., centers of the margins) of the memory device, as described herein above. Responsive to determining that the computed adjustment value satisfies the threshold voltage criterion voltage, the processing continues at operation 740; otherwise, the processing loops back to operation 715.

At operation 740, the processing logic performs one or more calibration operations for the identified block family in order to associate each die of the identified block family with one of the predefined threshold voltage offset bins, which is in turn associated with the voltage offset to be applied for read operations. The associations of blocks with block families and block families and dies with threshold voltage offset bins can be maintained in one or more metadata tables 610-630 stored on the one or more memory devices 130 of FIG.

At operation 745, the processing logic updates the threshold voltage offset associated with the block family based on the computed adjustment value. The updated threshold voltage offset can then be used by the memory sub-system controller for performing read operations with respect to one or more blocks of the block family.

Figure 8:
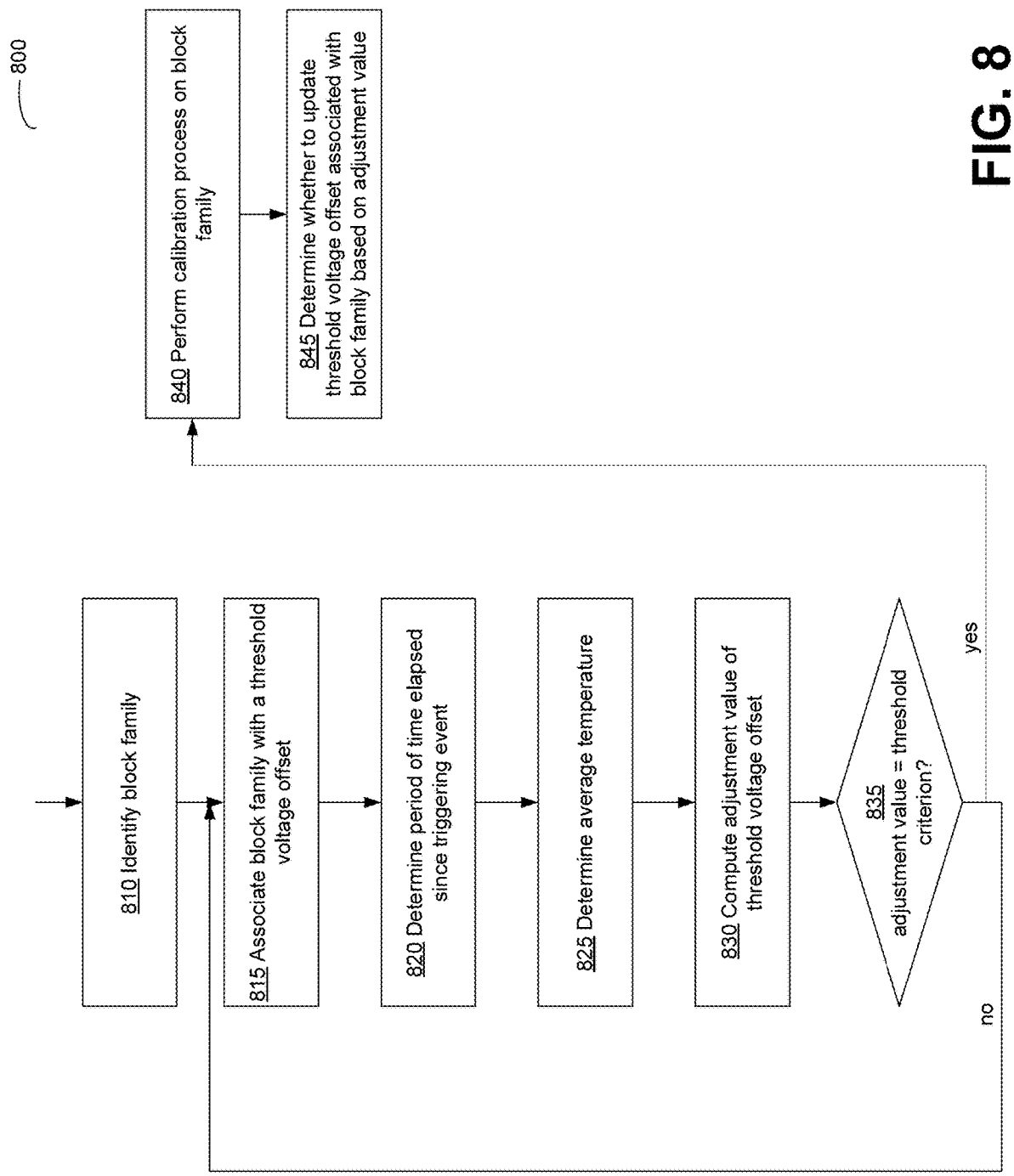
FIG. 8 is a flow diagram of an example method 800 of tracking charge loss implemented by a memory sub-system controller, in accordance with some embodiments of the present disclosure.

FIG. 8 is a flow diagram of an example method 800 of tracking charge loss implemented by a memory sub-system controller, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing logic identifies a block family. The block family can comprise a plurality of blocks of the memory device. In an illustrative example, identifying the block family can comprise randomly selecting the block family from the plurality of blocks of the memory device.

At operation 815, the processing logic associates the block family with a threshold voltage offset. In an illustrative example, the processing device utilizes the block family table 620 of FIG. 6, in order to determine the bin identifier corresponding to the combination of the block family identifier and the die identifier. The processing device then utilizes the offset table 630 of FIG. 6 in order to determine the threshold voltage offsets for the identified threshold voltage offset bin.

At operation 820, the processing logic determines the period of time that has elapsed since a triggering event. The triggering event may be, e.g., a programming or a calibration operation with respect to one or more blocks of the block family identified by operation 810. In an illustrative example, the processing logic can utilize the block family manager 510 and the current time 540 in determining the period of time elapsed since the triggering event. For example, the block family manager 510 can compute the difference between the current time 540 to the block family start time 550 in order to get the period of time that has elapsed since the triggering event.

At operation 825, the processing logic determines an average temperature measurement during the period of time that has elapsed since the triggering event at the selected die of the identified block family. The temperature measurement may be computed by the block family manager 510, as noted herein above.

At operation 830, the processing logic computes the adjustment value of the threshold voltage offset. In some embodiments, the adjustment value can be computed based on the elapsed period of time that the processing logic determines at operation 820 and the temperature measurement that the processing logic receives at operation 825. The adjustment value can be represented by a function of time raised to a power of a first coefficient and multiplied by a second coefficient. The function of time can reflect the elapsed period of time that the processing logic determines at operation 820. At least one of the first and the second coefficients can reflect the temperature of the memory component, such as the temperature measurement that the processing logic receives at operation 825. The adjustment value can be additively accumulated until the adjustment value satisfies a threshold voltage criterion. Additively accumulating the adjustment value can comprise, responsive to a first triggering event, storing a first adjustment value as an accumulated threshold voltage offset. Responsive to a second triggering event, a second adjustment value can be computed as described herein above. The second adjustment value can be additively applied to the accumulated threshold voltage offset. As noted herein above, metadata reflecting the temperature measurement, the period of time elapsed, the adjustment value, and the accumulated threshold voltage offset can be maintained in one or more metadata tables 610-630 stored on the one or more memory devices 130 of FIG. 1.

At operation 835, the processing logic determines whether the adjustment value satisfies a threshold voltage criterion. In some embodiments, the adjustment value can be reflected as the accumulated threshold voltage offset, as described herein above. The threshold voltage criterion can be, for example, one or more reference voltage levels corresponding to known valley margins (e.g., centers of the margins) of the memory device, as described herein above. Responsive to determining that the computed adjustment value equals the threshold voltage criterion voltage, the processing logic continues at operation 840; otherwise, the processing logic loops back to operation 815.

At operation 840, the processing logic performs one or more calibration operations for the identified block family in order to associate each die of the identified block family with one of the predefined threshold voltage offset bins, which is in turn associated with the voltage offset to be applied for read operations. The associations of blocks with block families and block families and dies with threshold voltage offset bins can be maintained in one or more metadata tables 610-630 stored on the one or more memory devices 130 of FIG.

At operation 845, the processing logic determines whether to update the threshold voltage offset associated with the identified block family based on the adjustment value. In an illustrative example, the processing logic determines whether the adjustment value satisfies a threshold voltage criterion, as described herein above. The processing logic then performs one or more calibration operations for the identified block family, as described herein above. During a calibration operation, the memory sub-system controller associates each die of every block family with a threshold voltage offset bin. The threshold voltage offset bin defines a set of threshold voltage offsets to be applied to the base voltage read level in order to perform read operations. Thus, in some embodiments, the processing logic can update the threshold voltage offset based on the threshold voltage offset bin associated with each die of the block family after a calibration operation. The updated threshold voltage offset can be used by the memory sub-system controller for performing read operations with respect to one or more blocks of the block family. For example, the updated threshold voltage offset can be additively applied to the "base read level" threshold voltage in order to get a new read voltage for the identified block family.

Figure 9:
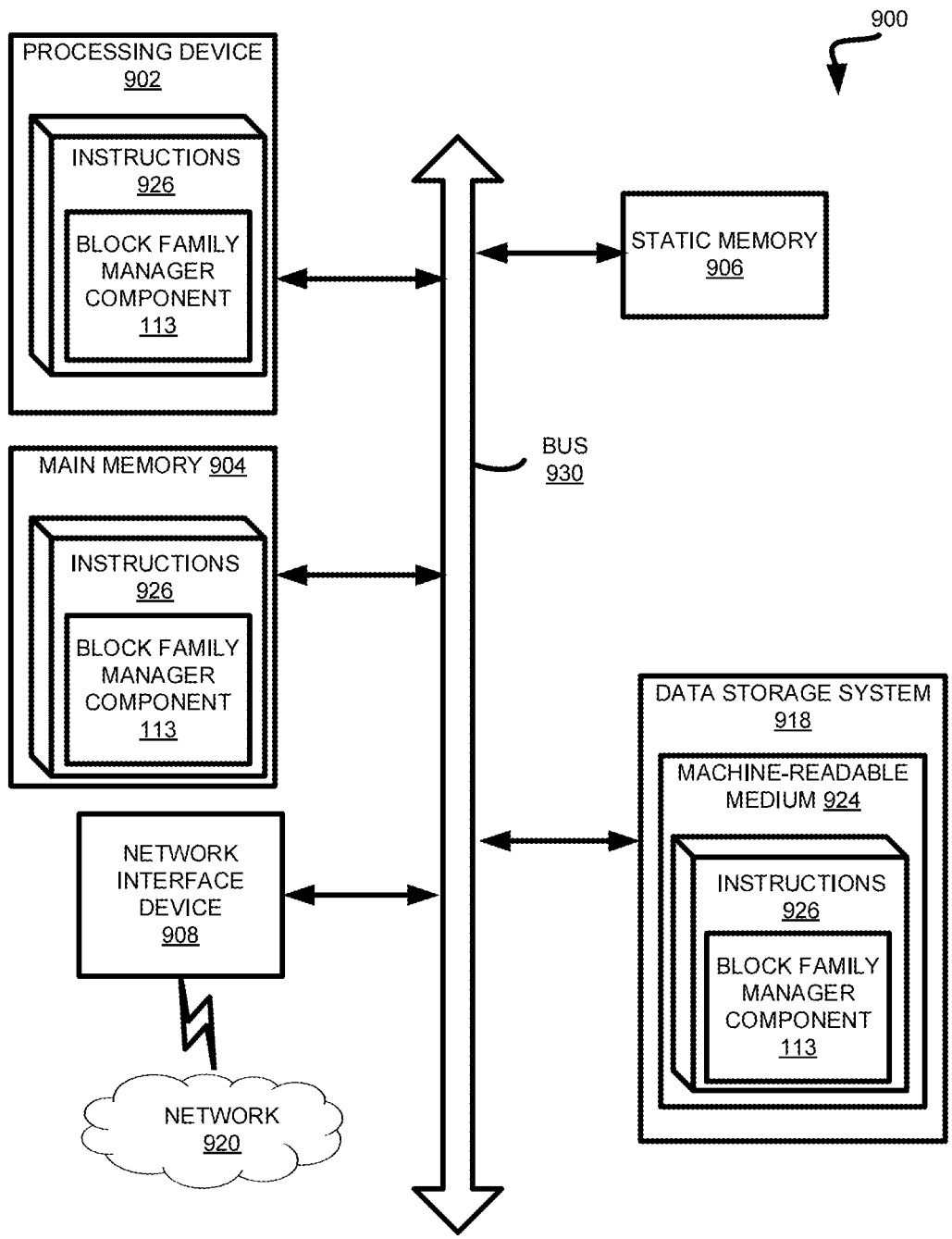
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or RDRAM, etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to a block family manager component (e.g., the block family manager component 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
identifying a block family comprising a plurality of blocks of the memory device;
associating the block family with a threshold voltage offset;
computing an adjustment value of the threshold voltage offset, wherein the adjustment value reflects a time period that has elapsed since a triggering event and a temperature of a memory component carrying one or more blocks of the plurality of blocks;
determining that the adjustment value satisfies a threshold voltage criterion, wherein the threshold voltage criterion comprises a reference voltage level corresponding to known valley margins of the memory device; and
responsive to determining that the adjustment value satisfies the threshold voltage criterion, updating the threshold voltage offset.

2. The system of claim 1, wherein the operations further comprise:
responsive to determining that the adjustment value satisfies the threshold voltage criterion, scanning the block family.

3. The system of claim 1, wherein a triggering event is a memory cell programming event associated with the block family.

4. The system of claim 1, wherein the adjustment value is represented by a function of time raised to a power of a first coefficient and multiplied by a second coefficient, wherein at least one of the first and the second coefficients reflects the temperature of the memory component.

5. The system of claim 1, wherein the operations further comprise:
storing, on the memory device, metadata reflecting the adjustment value and the threshold voltage offset.

6. The system of claim 1, wherein computing the adjustment value of the threshold voltage offset is performed by a hardware accelerator.

7. The system of claim 1, wherein the block family comprising the plurality of blocks of the memory device is identified randomly from the plurality of blocks of the memory device.

8. A method comprising:
identifying, by a processing device, a block family comprising a plurality of blocks of a memory device, wherein the block family is associated with a threshold voltage offset;
determining, by the processing device, an average temperature of a memory component carrying one or more blocks of the plurality of blocks;
computing an adjustment value of the threshold voltage offset, wherein the adjustment value reflects a time period that has elapsed since a triggering event and the average temperature of the memory component;
determining that the adjustment value satisfies a threshold voltage criterion, wherein the threshold voltage criterion comprises a reference voltage level corresponding to known valley margins of the memory device;
responsive to determining that the adjustment value satisfies the threshold voltage criterion, scanning one or more blocks of the block family; and
updating, based on the adjustment value, the threshold voltage offset associated with the block family.

9. The method of claim 8, further comprising:
responsive to determining that the adjustment value satisfies the threshold voltage criterion, scanning the block family.

10. The method of claim 8, wherein a triggering event comprises a memory cell programming event associated with the block family.

11. The method of claim 8, wherein the adjustment value is represented by a function of time raised to a power of a first coefficient and multiplied by a second coefficient, wherein at least one of the first and second coefficients reflects the temperature of the memory component.

12. The method of claim 8, further comprising storing metadata reflecting the adjustment value and the threshold voltage offset at the memory device.

13. The method of claim 8, wherein computing the adjustment value of the threshold voltage offset is performed by a hardware accelerator.

14. The method of claim 8, wherein the block family comprising the plurality of blocks of the memory device is identified randomly from the plurality of blocks of the memory device.

15. A non-transitory computer-readable storage medium comprising instructions that, when executed by a processing device, cause the processing device to perform operations comprising:
identifying a block family comprising a plurality of blocks of a memory device; associating the block family with a threshold voltage offset;
computing an adjustment value of the threshold voltage offset, wherein the adjustment value reflects a time period that has elapsed since a triggering event and a temperature of a memory component carrying one or more blocks of the plurality of blocks;
determining that the adjustment value satisfies a threshold voltage criterion, wherein the threshold voltage criterion comprises a reference voltage level corresponding to known valley margins of the memory device; and
responsive to determining that the adjustment value satisfies the threshold voltage criterion, updating the threshold voltage offset.

16. The non-transitory computer-readable storage medium of claim 15, further comprising:
responsive to determining that the adjustment value satisfies the threshold voltage criterion, scanning the block family.

17. The non-transitory computer-readable storage medium of claim 15, wherein a triggering event comprises a memory cell programming event associated with the block family.

18. The non-transitory computer-readable storage medium of claim 15, wherein the adjustment value is represented by a function of time raised to a power of a first coefficient and multiplied by a second coefficient, wherein at least one of the first and second coefficients reflects the temperature of the memory component.

19. The non-transitory computer-readable storage medium of claim 15, further comprising storing metadata reflecting the adjustment value and the threshold voltage offset at the memory device.

20. The non-transitory computer-readable storage medium of claim 15, wherein computing the adjustment value of the threshold voltage offset is performed by a hardware accelerator.

* * * * *